US008980066B2

(12) United States Patent
Ye

(10) Patent No.: US 8,980,066 B2
(45) Date of Patent: *Mar. 17, 2015

(54) THIN FILM METAL OXYNITRIDE SEMICONDUCTORS

(75) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 337 days.

This patent is subject to a terminal disclaimer.

(21) Appl. No.: 12/049,017

(22) Filed: Mar. 14, 2008

(65) Prior Publication Data

US 2009/0233424 A1    Sep. 17, 2009

(51) Int. Cl.
| | |
|---|---|
| *C23C 14/34* | (2006.01) |
| *C23C 14/00* | (2006.01) |
| *C23C 14/06* | (2006.01) |

(Continued)

(52) U.S. Cl.
CPC ......... *C23C 14/0063* (2013.01); *C23C 14/0676* (2013.01); *H01J 37/3408* (2013.01); *H01J 37/3429* (2013.01); *H01L 21/02521* (2013.01); *H01L 21/0254* (2013.01); *H01L 21/02554* (2013.01); *H01L 21/02565* (2013.01); *H01L 21/02573* (2013.01); *H01L 21/02631* (2013.01); *H01L 29/26* (2013.01); *H01L 31/18* (2013.01);

(Continued)

(58) Field of Classification Search
CPC ............. C23C 14/0676; C23C 14/0063; H01J 37/3408; H01J 37/3429; H01L 21/02521; H01L 21/0254; H01L 21/02554; H01L 21/02565; H01L 21/02573; H01L 21/02631; H01L 29/26; H01L 29/7869; H01L 31/18; H01L 31/20

USPC .......................... 204/192.15, 192.17, 192.25
See application file for complete search history.

(56) References Cited

U.S. PATENT DOCUMENTS 4,436,770 A * 3/1984 Nishizawa et al. ........... 427/570
4,695,432 A   9/1987 Colin et al.
(Continued)

FOREIGN PATENT DOCUMENTS

| CN | 1588623 A | 3/2005 |
|---|---|---|
| EP | 145403 A2 | 6/1985 |

(Continued)

OTHER PUBLICATIONS

Lu et al. "p-type conduction in N—Al co-doped ZnO thin films", Applied Physics Letters, vol. 85, No. 15, Oct. 2004, p. 3134-3135.*

(Continued)

*Primary Examiner* — Rodney McDonald
(74) *Attorney, Agent, or Firm* — Patterson & Sheridan, LLP

(57) ABSTRACT

The present invention generally relates to a semiconductor film and a method of depositing the semiconductor film. The semiconductor film comprises oxygen, nitrogen, and one or more elements selected from the group consisting of zinc, cadmium, gallium, indium, and tin. Additionally, the semiconductor film may be doped. The semiconductor film may be deposited by applying an electrical bias to a sputtering target comprising the one or more elements selected from the group consisting of zinc, cadmium, gallium, indium, and tin, and introducing a nitrogen containing gas and an oxygen containing gas. The sputtering target may optionally be doped. The semiconductor film has a mobility greater than amorphous silicon. After annealing, the semiconductor film has a mobility greater than polysilicon.

6 Claims, 4 Drawing Sheets

(51) Int. Cl.
| | |
|---|---|
| *H01J 37/34* | (2006.01) |
| *H01L 21/02* | (2006.01) |
| *H01L 29/26* | (2006.01) |
| *H01L 31/18* | (2006.01) |
| *H01L 31/20* | (2006.01) |
| *H01L 29/786* | (2006.01) |

(52) U.S. Cl.
CPC ............. *H01L 31/20* (2013.01); *H01L 29/7869* (2013.01); *Y02E 10/50* (2013.01)
USPC ............. 204/192.25; 204/192.15; 204/192.17

(56) References Cited

U.S. PATENT DOCUMENTS

| | | | |
|---|---|---|---|
| 4,769,291 A | 9/1988 | Belkind et al. | |
| 4,816,082 A | 3/1989 | Guha et al. | |
| 4,983,360 A * | 1/1991 | Merdrignac et al. | 422/90 |
| 5,279,679 A | 1/1994 | Murakami et al. | |
| 5,346,601 A | 9/1994 | Barada et al. | |
| 5,352,300 A | 10/1994 | Niwa | |
| 5,420,452 A | 5/1995 | Tran et al. | |
| 5,429,983 A | 7/1995 | Takizawa et al. | |
| 5,522,934 A | 6/1996 | Suzuki et al. | |
| 5,571,749 A | 11/1996 | Matsuda et al. | |
| 5,620,523 A | 4/1997 | Maeda et al. | |
| 5,668,663 A | 9/1997 | Varaprasad et al. | |
| 5,683,537 A | 11/1997 | Ishii | |
| 5,700,699 A | 12/1997 | Han et al. | |
| 5,716,480 A | 2/1998 | Matsuyama et al. | |
| 5,720,826 A | 2/1998 | Hayashi et al. | |
| 5,731,856 A | 3/1998 | Kim et al. | |
| 5,993,594 A | 11/1999 | Wicker et al. | |
| 6,153,013 A | 11/2000 | Sakai et al. | |
| 6,153,893 A | 11/2000 | Inoue et al. | |
| 6,159,763 A | 12/2000 | Sakai et al. | |
| 6,180,870 B1 | 1/2001 | Sano et al. | |
| 6,228,236 B1 | 5/2001 | Rosenstein et al. | |
| 6,238,527 B1 | 5/2001 | Sone et al. | |
| 6,329,269 B1 | 12/2001 | Hamada et al. | |
| 6,388,301 B1 | 5/2002 | Tawada et al. | |
| 6,458,673 B1 | 10/2002 | Cheung | |
| 6,700,057 B2 | 3/2004 | Yasuno | |
| 6,787,010 B2 | 9/2004 | Cuomo et al. | |
| 6,881,305 B2 | 4/2005 | Black et al. | |
| 6,943,359 B2 | 9/2005 | Vardeny et al. | |
| 7,026,713 B2 | 4/2006 | Hoffman et al. | |
| 7,145,174 B2 | 12/2006 | Chiang et al. | |
| 7,158,208 B2 | 1/2007 | De Jager et al. | |
| 7,189,992 B2 | 3/2007 | Wager, III et al. | |
| 7,235,810 B1 | 6/2007 | Yamazaki et al. | |
| 7,297,977 B2 | 11/2007 | Hoffman et al. | |
| 7,309,895 B2 | 12/2007 | Hoffman et al. | |
| 7,339,187 B2 | 3/2008 | Wager, III et al. | |
| 7,378,286 B2 * | 5/2008 | Hsu et al. | 438/3 |
| 7,382,421 B2 | 6/2008 | Hoffman et al. | |
| 7,601,984 B2 | 10/2009 | Sano et al. | |
| 7,626,201 B2 | 12/2009 | Chiang et al. | |
| 7,629,191 B2 | 12/2009 | Chiang et al. | |
| 7,750,440 B2 | 7/2010 | Yagi | |
| 7,879,698 B2 | 2/2011 | Ye | |
| 7,927,713 B2 | 4/2011 | Ye | |
| 8,398,826 B2 * | 3/2013 | Ye | 204/192.25 |
| 2002/0098616 A1 | 7/2002 | Kordesch | |
| 2002/0149053 A1 | 10/2002 | Tsunoda et al. | |
| 2003/0015234 A1 | 1/2003 | Yasuno | |
| 2003/0049464 A1 | 3/2003 | Glenn et al. | |
| 2004/0235224 A1 | 11/2004 | Lin et al. | |
| 2005/0017244 A1 | 1/2005 | Hoffman et al. | |
| 2005/0028860 A1 | 2/2005 | Sano et al. | |
| 2005/0136656 A1 | 6/2005 | Zeng et al. | |
| 2005/0181532 A1 | 8/2005 | Patel et al. | |
| 2006/0033106 A1 | 2/2006 | Seo et al. | |
| 2006/0046476 A1 | 3/2006 | Nakamura et al. | |
| 2006/0065299 A1 | 3/2006 | Fukawa et al. | |
| 2006/0108636 A1 | 5/2006 | Sano et al. | |
| 2006/0125098 A1 | 6/2006 | Hoffman et al. | |
| 2006/0258064 A1 | 11/2006 | Chen et al. | |
| 2006/0286725 A1 | 12/2006 | Cheng et al. | |
| 2007/0007125 A1 | 1/2007 | Krasnov et al. | |
| 2007/0026321 A1 | 2/2007 | Kumar | |
| 2007/0030569 A1 | 2/2007 | Lu et al. | |
| 2007/0065962 A1 | 3/2007 | Pichler | |
| 2007/0068571 A1 | 3/2007 | Li et al. | |
| 2007/0141784 A1 | 6/2007 | Wager et al. | |
| 2007/0197379 A1 | 8/2007 | Miura | |
| 2007/0252129 A1 | 11/2007 | Yagi | |
| 2007/0252147 A1 | 11/2007 | Kim et al. | |
| 2007/0252152 A1 | 11/2007 | Sato et al. | |
| 2008/0108198 A1 | 5/2008 | Wager et al. | |
| 2008/0132009 A1 | 6/2008 | Hirai | |
| 2008/0173870 A1 | 7/2008 | Kim et al. | |
| 2008/0224133 A1 | 9/2008 | Park et al. | |
| 2008/0264777 A1 | 10/2008 | Ye | |
| 2008/0272388 A1 | 11/2008 | Ushiyama et al. | |
| 2008/0308411 A1 | 12/2008 | Guo et al. | |
| 2009/0023959 A1 | 1/2009 | D'Amore et al. | |
| 2009/0026065 A1 * | 1/2009 | Nukeaw et al. | 204/157.44 |
| 2009/0045398 A1 | 2/2009 | Kato et al. | |
| 2009/0050884 A1 | 2/2009 | Ye | |
| 2009/0212287 A1 | 8/2009 | Nathan et al. | |
| 2009/0233424 A1 | 9/2009 | Ye | |
| 2009/0236597 A1 | 9/2009 | Ye | |
| 2009/0239335 A1 | 9/2009 | Akimoto et al. | |
| 2009/0305461 A1 | 12/2009 | Akimoto et al. | |
| 2010/0001274 A1 | 1/2010 | Ye | |
| 2010/0078633 A1 | 4/2010 | Watanabe | |
| 2010/0090215 A1 | 4/2010 | Lee | |
| 2010/0109002 A1 | 5/2010 | Itagaki et al. | |
| 2010/0117073 A1 | 5/2010 | Yamazaki et al. | |
| 2010/0120197 A1 | 5/2010 | Levy et al. | |
| 2010/0140611 A1 | 6/2010 | Itagaki et al. | |
| 2010/0193783 A1 | 8/2010 | Yamazaki et al. | |
| 2010/0252832 A1 | 10/2010 | Asano et al. | |

FOREIGN PATENT DOCUMENTS

| | | | |
|---|---|---|---|
| JP | 02-240637 A | | 9/1990 |
| JP | 06-045354 A | | 2/1994 |
| JP | 2006-144053 | * | 6/2006 |
| JP | 3958605 | | 5/2007 |
| KR | 1999009046 | | 3/1999 |
| KR | 2001-0011855 A | | 2/2001 |
| KR | 2001051193 | | 6/2001 |
| WO | WO-2008/133345 A1 | | 11/2008 |
| WO | WO-2010/002803 | | 1/2010 |

OTHER PUBLICATIONS

Zhuge et al. "ZnO p-n homojunctions and ohmic contacts to Al—N-co-doped p-type ZnO", Applied Physics Letters, vol. 87, Aug. 2005.*
Machine Translation JP 2006-144053 dated Jun. 8, 2006.*
Futsuhara et al. "Optical properties of zinc oxynitride thin films," Thin Solid Films, vol. 317, 1998 Elsevier, pp. 322-325.
International Search Report and Written Opinion dated Aug. 8, 2008 for International Application No. PCT/US08/59638.
International Search Report and Written Opinion dated Oct. 8, 2008 for International Application No. PCT/US08/71890.
Tu et al. "Nitrogen-doped *p*-type ZnO films prepared from nitrogen gas radio-frequency magnetron sputtering," Journal of Applied Physics, vol. 100, Issue 5, 2006 American Institute of Physics, pp. 053705-053705-4.
Zong et al. "Optical band gap of zinc nitride films prepared on quartz substrates from a zinc nitride target by reactive rf magnetron sputtering," Applied Surface Science, vol. 252, Nov. 22, 2006, pp. 7983-7986.
Ozgur, et al. "A comprehensive review of ZnO materials and devices," Journal of Applied Physics 98, 041301 (2005), American Institute of Physics.
Wang, et al. "Epitaxial growth of NH3-doped ZnO thin films on <0224> oriented sapphire substrates," Journal of Crystal Growth 255, Apr. 9, 2003, pp. 293-297.

(56) References Cited

OTHER PUBLICATIONS

Ye, et al. "Preparation and characteristics of p-type ZnO films by DC reactive magnetron sputtering," Journal of Crystal Growth 253, Feb. 4, 2003, pp. 258-264.
Korean Office Action dated Jul. 21, 2008 for Korean Application No. 10-2007-0066962.
Hiramatsu, et al. "Formation of TiN films with low Cl concentration by pulsed plasma chemical vapor deposition," American Vacuum Society, vol. 14, No. 3, May/Jun. 1996, pp. 1037-1040.
Toyoura et al., "Optical properties of zinc nitride formed by molten salt electrochemical process", Thin Film Solids 492 (2005), pp. 88-92.
Ma et al., "Method of control of nitrogen content in ZnO films: Structural and photoluminescence properties", J. Vac. Sci. Technol. B 22(1), Jan./Feb. 2004, pp. 94-98.
Fortunato et al., "Wide-bandgap high-mobility ZnO thin-film transistors produced at room temperature", Applied Physics Letters, vol. 85, No. 13, Sep. 27, 2004, pp. 2541-2543.
Hoffman et al., "ZnO-based transparent thin-film transistors", Applied Physics Letters, vol. 82, No. 5, Feb. 3, 2003, pp. 733-735.
Zong et al., "Optical band gap of zinc nitride films prepared on quartz substrates from a zinc nitride target by reactive rf magnetron sputtering", Applied Surface Science 252 (2006), pp. 7983-7986.
Bian et al., "Deposition and electrical properties of N—In codoped p-type ZnO films by ultrasonic spray pyrolysis", Applied Physics Letters, vol. 84, No. 4, Jan. 26, 2004, pp. 541-543.
Barnes et al., "On the formation and stability of p-type conductivity in nitrogen-doped zinc oxide", Applied Physics Letters, 86, 112112 (2005).
Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.
Hosano et al., "Working hypothesis to explore novel wide band gap electrically conducting amorphous oxides and examples", Journal of Non-Crystalline Solids, 198-200 (1996) pp. 165-169.
Park et al., "Highly Stable $Ga_2O_3$—$In_2O_3$—ZnO Thin-Film Transistors for AM-OLED Application", IDW '07, pp. 1775-1778.
Kwon et al., "4 inch QVGA AMOLED display driven by GaInZnO TFT", IDW '07, pp. 1783-1786.
Perkins et al., "Identification of nitrogen chemical states in N-doped ZnO via x-ray photoelectron spectroscopy", Journal of Applied Physics 97, 034907 (2005).
Yao et al., "Effects of nitrogen doping and illumination on lattice constants and conductivity behavior of zinc oxide grown by magnetron sputtering", Journal of Applied Physics 99, 123510 (2006).
Tu et al., "Nitrogen-doped p-type ZnO films prepared from nitrogen gas radio-frequency magnetron sputtering", Journal of Applied Physics 100, 053705 (2006).
Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.
Lee et al., "42.2: World's Largest (15-inch) XGA AMLCD Panel Using IGZO Oxide TFT", SID 08 Digest, pp. 625-628.
Zong et al., "Structural properties of zinc nitride empty balls", Materials Letters 60 (2006), pp. 905-908.
Nomura et al., "Room-temperature fabrication of transparent flexible thin-film transistors using amorphous oxide semiconductors", Nature, vol. 432, Nov. 25, 2004, pp. 788-492.
Minami, Tadatsugu, "New n-Type Transparent Conducting Oxides", MRS Bulletin, Aug. 2000.
Zong et al., "Synthesis and thermal stability of $Zn_3N_2$ powder", Solid State Communications 132 (2004), pp. 521-525.
Kaminska et al., "Transparent p-type ZnO films obtained by oxidation of sputter-deposited $Zn_3N_2$", Solid State Communications, 135 (2005), pp. 11-15.
Son et al., "42.4L: Late-News Paper: 4 inch QVGA AMOLED Driven by the Threshold Voltage Controlled Amorphous GIZO ($Ga_2O_3$—$In_2O_3$—ZnO) TFT", SID 08 Digest, pp. 633-636.

Futushara et al., "Optical properties of zinc oxynitride thin films", Thin Film Solids, 317 (1998), pp. 322-325.
Futushara et al., "Structural, electrical and optical properties of zinc nitride thin films prepared by reactive rf magnetron sputtering", Thin Film Solids, 322 (1998), pp. 274-281.
Carcia et al., "Transparent ZnO thin-film transistor fabricated by rf magnetron sputtering", Applied Physics Letters, col. 82, No. 7, Feb. 17, 2003, pp. 1117-1119.
Yan et al., "Control of Doping by Impurity Chemical Potentials: Predictions for p-type ZnO", Physical Review Letters, vol. 86, No. 25, Jun. 18, 2001, pp. 5723-5726.
Ohya et al., "Thin Film Transistor of ZnO Fabricated by Chemical Solution Deposition", Jpn. J. Appl. Phys., vol. 40 (2001), pp. 297-298.
Hossain, et al., "Modeling and simulation of polycrystalline ZnO thin-film transistors", Journal of Applied Physics, vol. 94, No. 12, Dec. 15, 2003, pp. 7768-7777.
Park et al., "Challenge to Future Displays: Transparent AM-OLED driven by PEALD grown ZnO TFT", IMID '07 Digest, pp. 1249-1252.
Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.
International Search Report and Written Opinion of the International Searching Authority mailed Aug. 28, 2009 in PCT/US2009/036035.
Son et al., "Threshold Voltage Control of Amorphous Gallium Indium Zinc Oxide TFTs by Suppressing Back-Channel Current" Electrochemical and Solid-State Letters, 12 (1) H26-H28 (2009).
Freeman et al., "Chemical and Thin-Film Strategies for New Transparent Conducting Oxides", MRS Bulletin, Aug. 2000, p. 45-51.
Jin et al., "Optical properties of transparent and heat reflecting ZnO:Al films made by reactive sputtering", Appl. Phys. Lett. 51 (3), Jul. 20, 1987, p. 149-151.
Pei et al., "Optical and electrical properties of direct-current magnetron sputtered ZnO:Al films", Journal of Applied Physics, vol. 90, No. 7, Oct. 1, 2001, p. 3432-3436.
Gordon, "Criteria for Choosing Transparent Conductors", MRS Bulletin, Aug. 2000, p. 52-57.
European search report dated Jun. 30, 2010 for European Patent Application 08797025.7.
Barnes et al., "A comparison of plasma-activated N2/O2 and N2)/O2 mixtures for use in ZnO:N synthesis by chemical vapor deposition", Journal of Applied Physics, vol. 96, No. 12 (Dec. 2004).
Cao et al., "Low resistivity p-ZnO films fabricated by sol-gel spin coating", Applied Physics Letters, 88, 251116 (Jun. 2006).
Zhao et al., "Growth of nitrogen-doped p-type ZnO films by spray pyrolysis and their electrical and optical properties", Journal of Crystal Growth, 280 (May 2005), pp. 495-501.
Barnes et al., "A comparison of plasma-activated N2/O2 and N2O/O2 mixtures for use in ZnO:N synthesis by chemical vapor deposition", Journal of Applied Physics, vol. 96, No. 12 (Dec. 2004).
Zhao et al., "Growth of nitrogen-doped p-type ZnO films by spray pyrolysis and their electrical and optical properties", Journal of Crystal Growth, 280 (May 2005), 495-501.
Ye et al., "High mobility amorphous zinc oxynitride semiconductor material for thin film transistors", Journal of Applied Physics, 106, 074512 (2009).
Chiang et al., "High mobility transparent thin-film transistors with amorphous zinc tin oxide channel layer", Appl. Phys. Lett., 86, 013503 (2005).
Fortunato et al., "Wide-bandgap high-mobility ZnO thin-film transistors produced at room temperature", Applied Physics Letters, vol. 85, No. 13, 2541-2543.
Jackson et al., "High-performance flexible zinc tin oxide field-effect transistors", Applied Physics Letters, 87, 193503 (2005).
First Office Action for Chinese Patent Application No. 200880015621.X dated Nov. 24, 2010.
Wang et al., "Fabrication and characteristics of the low-resistive p-type ZnO thin films by DC reactive magnetron sputtering", Materials Letters, vol. 60, p. 912-914, Dec. 31, 2006.

(56) References Cited

OTHER PUBLICATIONS

Wang, "The optical and electrical characteristics and the microstructure of Al doped zinc oxide thin films", Dept. of Information material science and engineering Guilin, vol. 25(02), p. 19-22, Apr. 20, 2005.

Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.

Search report and written opinion for PCT/US2009/047966 dated Dec. 27, 2010.

Search report and written opinion for PCT/US2009/049092 dated Dec. 27, 2010.

dit Picard et al., "Detection of NH3 and H2S with thick film semiconductor sensors based on Cd2—xGeO4—x—3yN2y oxynitrides", Sensors and Actuators B, vol. 42, 1997, pp. 47-51.

Office Action for Chinese Patent Application No. 200880106291.5 dated Mar. 30, 2011.

International Search Report and Written Opinion for PCT/US2010/049239 dated May 4, 2011.

Taiwanese Office Action for Application No. 98108079 dated Nov. 11, 2013.

Yan Ye; SID Information Display; Zinc-Oxynitride TFTs: Toward a New High-Mobility Low-Cost Thin-Film Semiconductor; dated Mar./Apr. 2013; 7 total pages.

\* cited by examiner

THIN FILM METAL OXYNITRIDE SEMICONDUCTORS

BACKGROUND OF THE INVENTION

1. Field of the Invention

Embodiments of the present invention generally relate to a semiconductor material and a method for depositing the semiconductor material.

2. Description of the Related Art

The electron mobility of a semiconductor layer has a very strong effect on the speed of the device and the current which may be driven through the device. The higher the electron mobility, the faster the speed of the device and the higher the source-drain current under the same voltage. In recent years, amorphous silicon and polysilicon have been the semiconductor materials of choice for field effect thin film transistors (TFTs), for backplane to drive liquid crystal displays (LCDs), organic light emitting diode (OLED) displays, quantum dot displays, and building solar cell panels. Amorphous silicon may have an electron mobility as high as about 1 $cm^2/V$-s. Low temperature polysilicon may have an electron mobility higher than 50 $cm^2/V$-s, but requires a complicated process step such as laser annealing to achieve the electron mobility. Therefore, the cost of producing polysilicon with an electron mobility higher than 50 $cm^2/V$-s is very high and not suitable for large area substrate applications.

In a field effect transistor (FET), the semiconductor material creates the channel between the source and drain electrodes. Without a voltage supply to the gate electrode, no current may go through the source-drain electrode even with a voltage between the source-drain electrodes. As voltage is supplied to the gate electrode, mobile electrons inside the semiconductor layer will accumulate in the area very close to the interface between the gate dielectric layer and the semiconductor layer. The semiconductor layer becomes conductive, and electrodes may go through the source-drain electrode easily with a low voltage between the source-drain electrodes. High mobility of the semiconductor materials indicates the mobile electrons in the semiconductor are more sensitive to the electric field created by the gate electrode, and the semiconductor channel becomes more conductive. The semiconductor material determines the current which may go through the semiconductor channel influenced by voltage applied across the gate and source terminals. The greater the mobility of the semiconductor material, the less voltage is needed to achieve the current required across the FET.

Amorphous silicon may rely upon hydrogen passivation to achieve a desired mobility in a TFT. The amorphous silicon may be deposited by chemical vapor deposition (CVD) at temperatures up to about 350 degrees Celsius. The hydrogen passivation, while helping the amorphous silicon achieve the desired mobility, may not be stable such that a TFT's threshold voltage may change with time under gate electrode voltage and under relatively high temperatures created by the device itself.

Therefore, there is a need in the art for a stable semiconductor material having sufficiently high mobility not only on glass substrates with high process temperatures, but also on plastic substrates and other flexible substrates.

SUMMARY OF THE INVENTION

The present invention generally relates to a semiconductor film and a method of depositing the semiconductor film. The semiconductor film comprises oxygen, nitrogen, and one or more elements selected from the group consisting of zinc, cadmium, gallium, indium, and tin. Additionally, the semiconductor film may be doped. The semiconductor film may be deposited by applying an electrical bias to a sputtering target comprising the one or more elements selected from the group consisting of zinc, cadmium, gallium, indium, and tin, and introducing a nitrogen containing gas and an oxygen containing gas. The sputtering target may optionally be doped. The semiconductor film has a mobility greater than amorphous silicon. After annealing, the semiconductor film has a mobility greater than polysilicon.

In one embodiment, a sputtering method comprises flowing an oxygen containing gas and a nitrogen containing gas into a processing chamber, applying an electrical bias to a sputtering target comprising one or more metals selected from the group consisting of gallium, cadmium, indium, and tin, and depositing a semiconductor layer on the substrate, the semiconductor layer comprising the one or more metals, oxygen, and nitrogen.

In another embodiment, a semiconductor material comprises nitrogen, oxygen, and one or more elements selected from the group consisting of gallium, cadmium, indium, and tin. In another embodiment, a semiconductor material comprises oxygen, nitrogen, and one or more elements having a filled s orbital and a filled d orbital.

In another embodiment, a semiconductor layer deposition method comprises introducing an oxygen containing precursor, a nitrogen containing precursor, and at least one precursor selected from the group consisting of a gallium precursor, a cadmium precursor, a tin precursor, and an indium precursor to a processing chamber and depositing a semiconductor layer on a substrate disposed in the processing chamber, the semiconductor layer comprising oxygen, nitrogen, and at least one element selected from the group consisting of gallium, cadmium, tin, and indium.

In another embodiment, a semiconductor layer deposition method comprises flowing an oxygen containing gas and a nitrogen containing gas into a processing chamber, applying an electrical bias to a sputtering target comprising one or more elements having a filled s orbital and a filled d orbital, and depositing a semiconductor layer on the substrate, the semiconductor layer comprising the one or more elements, oxygen, and nitrogen.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to a semiconductor film and a method of depositing the semiconductor film. The semiconductor film comprises oxygen, nitrogen, and one or more elements selected from the group consisting of zinc, cadmium, gallium, indium, and tin. Additionally, the semiconductor film may be doped. The semiconductor film may be deposited by applying an electrical bias to a sputtering target comprising the one or more elements selected from the group consisting of zinc, cadmium, gallium, indium, and tin, and introducing a nitrogen containing gas and an oxygen containing gas. The sputtering target may optionally be doped. The semiconductor film has a mobility greater than amorphous silicon. After annealing, the semiconductor film has a mobility greater than polysilicon.

A reactive sputtering method is illustratively described and may be practiced in a PVD chamber for processing large area substrates, such as a 4300 PVD chamber, available from AKT, a subsidiary of Applied Materials, Inc., Santa Clara, Calif. However, because the semiconductor film produced according to the method may be determined by the film structure and composition, it should be understood that the reactive sputtering method may have utility in other system configurations, including those systems configured to process large area round substrates and those systems produced by other manufacturers, including roll-to-roll process platforms. It is also to be understood that while the invention is illustratively described below as deposited by PVD, other methods including chemical vapor deposition (CVD), atomic layer deposition (ALD), or spin-on processes may be utilized to deposit the inventive films.

Figure 1:
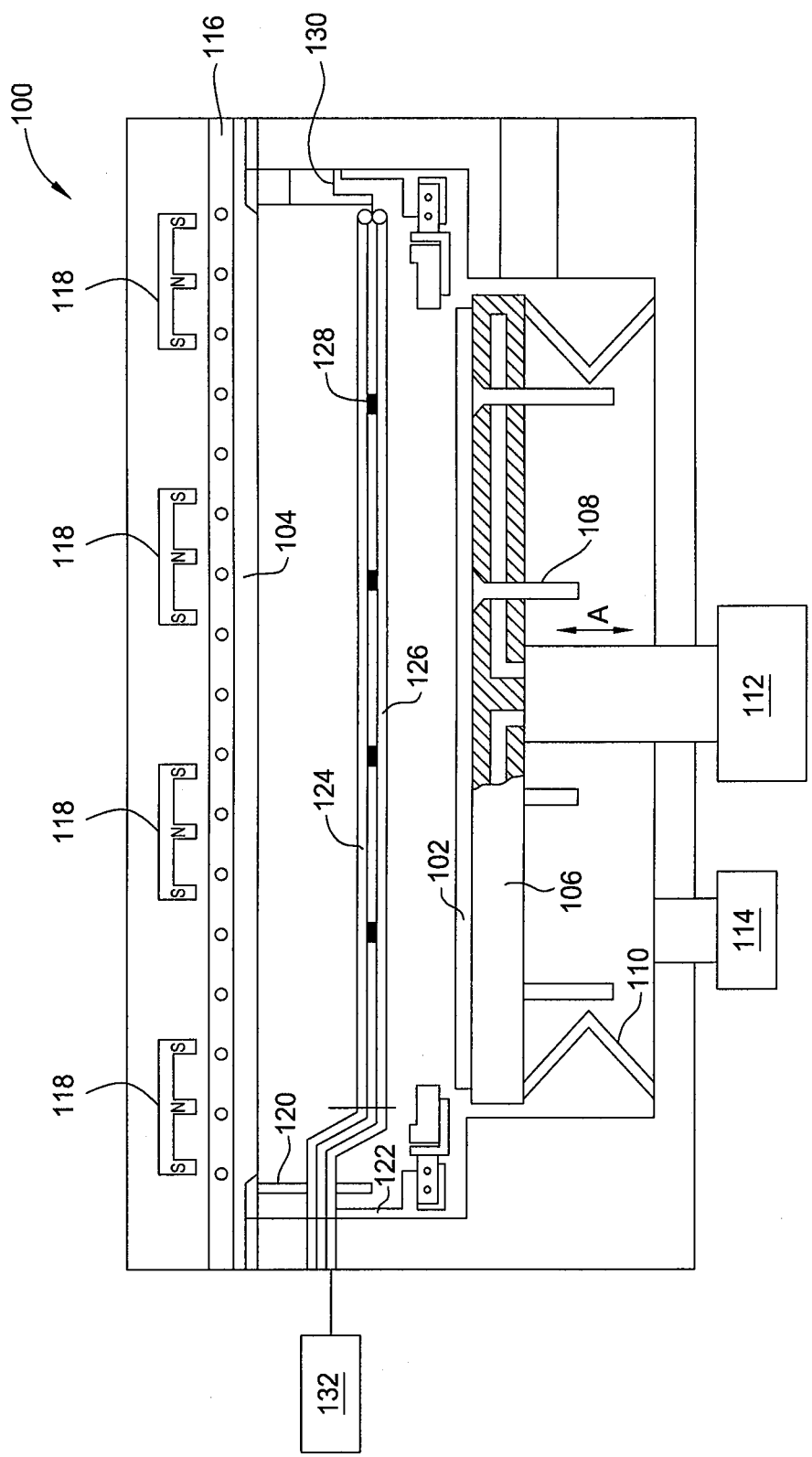
FIG. 1 is a schematic cross sectional view of a sputtering chamber that may be used to deposit the semiconductor film according to one embodiment of the invention.

FIG. 1 is a cross-sectional schematic view of a PVD chamber 100 according to one embodiment of the invention. The chamber 100 may be evacuated by a vacuum pump 114. Within the chamber 100, a substrate 102 may be disposed opposite a target 104. The substrate may be disposed on a susceptor 106 within the chamber 100. The susceptor 106 may be elevated and lowered as shown by arrows "A" by an actuator 112. The susceptor 106 may be elevated to raise the substrate 102 to a processing position and lowered so that the substrate 102 may be removed from the chamber 100. Lift pins 108 elevate the substrate 102 above the susceptor 106 when the susceptor 106 is in the lowered position. Grounding straps 110 may ground the susceptor 106 during processing. The susceptor 106 may be raised during processing to aid in uniform deposition. The temperature of the susceptor 106 may be maintained within a range of about room temperature to about 400 degrees Celsius. In one embodiment, the temperature of the susceptor 106 may be maintained between about 25 degrees Celsius and about 250 degrees Celsius.

The target 104 may comprise one or more targets 104. In one embodiment, the target 104 may comprise a large area sputtering target 104. In another embodiment, the target 104 may comprise a plurality of tiles. In yet another embodiment, the target 104 may comprise a plurality of target strips. In still another embodiment, the target 104 may comprise one or more cylindrical, rotary targets. The target 104 may be bonded to a backing plate 116 by a bonding layer (not shown). One or more magnetrons 118 may be disposed behind the backing plate 116. The magnetrons 118 may scan across the backing plate 116 in a linear movement or in a two dimensional path. The walls of the chamber may be shielded from deposition by a dark space shield 120 and a chamber shield 122.

To help provide uniform sputtering deposition across a substrate 102, an anode 124 may be placed between the target 104 and the substrate 102. In one embodiment, the anode 124 may be bead blasted stainless steel coated with arc sprayed aluminum. In one embodiment, one end of the anode 124 may be mounted to the chamber wall by a bracket 130. The anode 124 provides a charge in opposition to the target 104 so that charged ions will be attracted thereto rather than to the chamber walls which are typically at ground potential. By providing the anode 124 between the target 104 and the substrate 102, the plasma may be more uniform, which may aid in the deposition. To reduce flaking, a cooling fluid may be provided through the one or more anodes 124. By reducing the amount of expansion and contraction of the anodes 124, flaking of material from the anodes 124 may be reduced. For smaller substrates and hence, smaller processing chambers, the anodes 124 spanning the processing space may not be necessary as the chamber walls may be sufficient to provide a path to ground and a uniform plasma distribution.

For reactive sputtering, it may be beneficial to provide a reactive gas into the chamber 100. One or more gas introduction tubes 126 may also span the distance across the chamber 100 between the target 104 and the substrate 102. For smaller substrates and hence, smaller chambers, the gas introduction tubes 126 spanning the processing space may not be necessary as an even gas distribution may be possible through conventional gas introduction means. The gas introduction tubes 126 may introduce sputtering gases from a gas panel 132. The gas introduction tubes 126 may be coupled with the anodes 124 by one or more couplings 128. The coupling 128 may be made of thermally conductive material to permit the gas introduction tubes 126 to be conductively cooled. Additionally, the coupling 128 may be electrically conductive as well so that the gas introduction tubes 126 are grounded and function as anodes.

The reactive sputtering process may comprise disposing a metallic sputtering target opposite a substrate in a sputtering chamber. The metallic sputtering target may substantially comprise one or more elements selected from the group consisting of zinc, gallium, indium, tin, and cadmium. In one embodiment, the sputtering target may comprise one or more elements having a filled s orbital and a filled d orbital. In another embodiment, the sputtering target may comprise one or more elements having a filled f orbital. In another embodiment, the sputtering target may comprise one or more divalent elements. In another embodiment, the sputtering target may comprise one or more trivalent elements. In still another embodiment, the sputtering target may comprise one or more tetravalent elements.

The sputtering target may also comprise a dopant. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In another embodiment, the dopant comprises tin. The substrate, on the other hand, may comprise plastic, paper, polymer, glass, stainless steel, and combinations thereof. When the substrate is plastic, the reactive sputtering may occur at temperatures below about 180 degrees Celsius. Examples of semiconductor films that may be deposited include $ZnO_xN_y$:Al, $ZnO_xN_y$:Sn, $SnO_xN_y$:Al, $InO_xN_y$:Al, $InO_xN_y$:Sn, $CdO_xN_y$:Al, $CdO_xN_y$:Sn, $GaO_xN_y$:Al, $GaO_xN_y$:Sn, $ZnSnO_xN_y$:Al $ZnInO_xN_y$:Al, $ZnInO_xN_y$:Sn, $ZnCdO_xN_y$:Al, $ZnCdO_xN_y$:Sn, $ZnGaO_xN_y$:Al, $ZnGaO_xN_y$:Sn, $SnInO_xN_y$:Al, $SnCdO_xN_y$:Al, $SnGaO_xN_y$:Al, $InCdO_xN_y$:Al, $InCdO_xN_y$:Sn, $InGaO_xN_y$:Al, $InGaO_xN_y$:Sn, $CdGaO_xN_y$:Al, $CdGaO_xN_y$:Sn, $ZnSnInO_xN_y$:Al, $ZnSnCdO_xN_y$:Al, $ZnSnGaO_xN_y$:Al, $ZnInCdO_xN_y$:Al, $ZnInCdO_xN_y$:Sn, $ZnInGaO_xN_y$:Al, $ZnInGaO_xN_y$:Sn, $ZnCdGaO_xN_y$:Al, $ZnCdGaO_xN_y$:Sn, $SnInCdO_xN_y$:Al, $SnInGaO_xN_y$:Al, $SnCdGaO_xN_y$:Al, $InCdGaO_xN_y$:Al, $InCdGaO_xN_y$:Sn, ZnSnInCdO$_x$N$_y$:Al, ZnSnInGaO$_x$N$_y$:Al, ZnInCdGaO$_x$N$_y$:Al, ZnInCdGaO$_x$N$_y$:Sn, and SnInCdGaO$_x$N$_y$:Al.

During the sputtering process, argon, a nitrogen containing gas, and an oxygen containing gas may be provided to the chamber for reactive sputtering the metallic target. Additional additives such as B$_2$H$_6$, CO$_2$, CO, CH$_4$, and combinations thereof may also be provided to the chamber during the sputtering. In one embodiment, the nitrogen containing gas comprises N$_2$. In another embodiment, the nitrogen containing gas comprises N$_2$O, NH$_3$, or combinations thereof. In one embodiment, the oxygen containing gas comprises O$_2$. In another embodiment, the oxygen containing gas comprises N$_2$O. The nitrogen of the nitrogen containing gas and the oxygen of the oxygen containing gas react with the metal from the sputtering target to form a semiconductor material comprising metal, oxygen, nitrogen, and optionally a dopant on the substrate. In one embodiment, the nitrogen containing gas and the oxygen containing gas are separate gases. In another embodiment, the nitrogen containing gas and the oxygen containing gas comprise the same gas.

The film deposited is a semiconductor film. Examples of semiconductor films that may be deposited include ZnO$_x$N$_y$, SnO$_x$N$_y$, InO$_x$N$_y$, CdO$_x$N$_y$, GaO$_x$N$_y$, ZnSnO$_x$N$_y$, ZnInO$_x$N$_y$, ZnCdO$_x$N$_y$, ZnGaO$_x$N$_y$, SnInO$_x$N$_y$, SnCdO$_x$N$_y$, SnGaO$_x$N$_y$, InCdO$_x$N$_y$, InGaO$_x$N$_y$, CdGaO$_x$N$_y$, ZnSnInO$_x$N$_y$, ZnSnCdO$_x$N$_y$, ZnSnGaO$_x$N$_y$, ZnInCdO$_x$N$_y$, ZnInGaO$_x$N$_y$, ZnCdGaO$_x$N$_y$, SnInCdO$_x$N$_y$, SnInGaO$_x$N$_y$, SnCdGaO$_x$N$_y$, InCdGaO$_x$N$_y$, ZnSnInCdO$_x$N$_y$, ZnSnInGaO$_x$N$_y$, ZnInCdGaO$_x$N$_y$, and SnInCdGaO$_x$N$_y$. Each of the aforementioned semiconductor films may be doped by a dopant.

The semiconductor film may comprise an oxynitride compound. In one embodiment, the semiconductor film comprises both a metal oxynitride compound as well as a metal nitride compound. In another embodiment, the semiconductor film may comprise a metal oxynitride compound, a metal nitride compound, and a metal oxide compound. In still another embodiment, the semiconductor film may comprise a metal oxynitride compound and a metal oxide compound. In another embodiment, the semiconductor film may comprise a metal nitride compound and a metal oxide compound.

The ratio of the nitrogen containing gas to the oxygen containing gas may affect the mobility, carrier concentration, and resistivity of the semiconductor film. Table I shows the effect of the nitrogen flow rate on the mobility, resistivity, and carrier concentration for a tin target sputtered in an atmosphere of argon and nitrogen gas. Generally, Table I shows that when the nitrogen flow rate increases, the mobility also increases. The argon and oxygen flow rates may remain the same. In Table I, the argon flow rate is 60 sccm and the oxygen flow rate is 5 sccm. The higher substrate temperature also provides an increase in mobility. The carrier concentration is weakly correlated with the mobility. The deposited film is an n-type semiconductor material which may function as an electron carrier and hence, the carrier concentration is shown as a negative number.

TABLE I

| N$_2$ Flow Rate (sccm) | Temperature (Celsius) | Mobility (cm$^2$/V-s) | Carrier Concentration (#/cc) | Resistivity (ohm-cm) |
|---|---|---|---|---|
| 0 | 150 | 0.3 | −1.00E+23 | 0.0005 |
| 50 | 150 | 0.2 | −6.00E+20 | 0.12 |
| 100 | 150 | 1.1 | −2.00E+15 | 7000 |
| 150 | 150 | 1.1 | −5.00E+19 | 0.12 |
| 200 | 150 | 3.7 | −8.00E+19 | 0.05 |
| 0 | 250 | 0.4 | −3.00E+18 | 10 |
| 50 | 250 | 0.2 | −3.00E+21 | 0.09 |
| 100 | 250 | 0.4 | −9.00E+17 | 90 |
| 150 | 250 | 1.8 | −3.00E+18 | 3 |
| 200 | 250 | 7.1 | 9.00E+19 | 0.01 |

The oxygen containing gas also affects the mobility, carrier concentration, and resistivity of the semiconductor film. Table II shows the effect of the oxygen flow rate on the mobility, resistivity, and carrier concentration for a tin target sputtered in an atmosphere of argon, nitrogen gas, and oxygen gas. The argon flow rate may remain the same. In Table II, the argon flow rate is 60 sccm. Generally, Table II shows that for high nitrogen gas to oxygen gas ratios, the mobility may be higher than the mobility for amorphous silicon. Additionally, the higher the ratio of nitrogen to oxygen, the lower the carrier concentration. At a 200 sccm nitrogen flow rate, the mobility increases as the oxygen flow rate increase, but then decreases at higher oxygen flow rates. In one embodiment, the mobility may be between about 4 cm$^2$/V-s and about 10 cm$^2$/V-s at a temperature of 150 degrees Celsius. The increase in mobility is not correlated to the carrier concentration. Thus, the mobility improvement may be a result of less scattering of the carrier. The mobility may be very low if no nitrogen additives are used. In such a scenario, the carrier concentration drops significantly as the oxygen gas flow increases. The higher the substrate temperature for a tin target, the better the mobility. In one embodiment, the pressure may be between about 5 mTorr to about 20 mTorr.

TABLE II

| O$_2$ Flow Rate (sccm) | N$_2$ Flow Rate (sccm) | Temperature (Celsius) | Mobility (cm$^2$/V-s) | Carrier Concentration (#/cc) | Resistivity (ohm-cm) |
|---|---|---|---|---|---|
| 5 | 0 | 150 | 0.1 | −2.00E+23 | 0.0005 |
| 10 | 0 | 150 | 0.2 | −2.00E+18 | 40 |
| 0 | 200 | 150 | 1.2 | −3.00E+19 | 0.03 |
| 5 | 200 | 150 | 4.2 | −9.00E+19 | 0.04 |
| 10 | 200 | 150 | 3.5 | −1.00E+20 | 0.05 |
| 0 | 200 | 250 | 0.2 | −3.00E+19 | 10 |
| 5 | 200 | 250 | 7.0 | −9.00E+19 | 0.01 |
| 10 | 200 | 250 | 9.5 | −9.00E+19 | 0.008 |

The amount of dopant may also affect the mobility of the deposited film. However, the mobility will still generally increase with an increase of nitrogen gas flow whether the target is doped or not. Table III shows the effect of dopant upon the mobility, carrier concentration, and resistivity. The dopant is shown in weight percentage. The argon flow rate may be the same for each deposited film. In Table III, the argon flow rate is 120 sccm. The carrier concentration when utilizing a dopant may be lower than in the scenario where no dopant is used. Thus, the dopant may be used to tune the carrier concentration.

TABLE III

| O$_2$ Flow Rate (sccm) | N$_2$ Flow Rate (sccm) | Percent Dopant (%) | Temperature (Celsius) | Mobility (cm$^2$/V-s) | Carrier Concentration (#/cc) | Resistivity (ohm-cm) |
|---|---|---|---|---|---|---|
| 10 | 100 | 1 | 50 | 1 | −1.00E+21 | 0.009 |
| 10 | 200 | 1 | 50 | 14 | −4.00E+19 | 0.02 |
| 10 | 300 | 1 | 50 | 31 | −9.00E+18 | 0.04 |
| 10 | 400 | 1 | 50 | 34 | −5.00E+18 | 0.07 |
| 10 | 500 | 1 | 50 | 34 | −4.00E+18 | 0.09 |
| 20 | 100 | 0 | 50 | 2 | −1.00E+21 | 0.008 |
| 20 | 200 | 0 | 50 | 14 | −8.00E+19 | 0.009 |
| 20 | 300 | 0 | 50 | 29 | −2.00E+19 | 0.02 |
| 20 | 400 | 0 | 50 | 42 | −1.00E+19 | 0.03 |
| 20 | 500 | 0 | 50 | 45 | −8.00E+18 | 0.04 |
| 20 | 100 | 1 | 50 | 13 | −5.00E+19 | 0.03 |
| 20 | 200 | 1 | 50 | 27 | −3.00E+18 | 0.01 |
| 20 | 300 | 1 | 50 | 29 | −2.00E+18 | 0.01 |
| 20 | 400 | 1 | 50 | 29 | −2.00E+18 | 0.01 |
| 20 | 500 | 1 | 50 | 32 | −1.00E+18 | 0.03 |

Table IV discloses the effect of oxygen gas flow on the mobility, carrier concentration, and resistivity of the semiconductor film. Generally, under a fixed nitrogen gas flow, the mobility of the film will increase as the oxygen flow increases, but drop with a further increase in oxygen flow rate. The argon flow rate may be the same for each deposited film. In Table III, the argon flow rate is 120 sccm. In one embodiment, the mobility of the film will decrease once the nitrogen containing gas to oxygen containing gas ratio is less than about 10:1. The increase in mobility does not relate to an increase in carrier concentration as the oxygen flow rate increases. When a dopant is used, the mobility and carrier concentration may be lowered. Thus, the carrier concentration and mobility may be tuned with the amount of dopant present.

TABLE IV

| O$_2$ Flow Rate (sccm) | N$_2$ Flow Rate (sccm) | Percent Dopant (%) | Temperature (Celsius) | Mobility (cm$^2$/V-s) | Carrier Concentration (#/cc) | Resistivity (ohm-cm) |
|---|---|---|---|---|---|---|
| 0 | 300 | 1 | 50 | 0 | −3.00E+21 | 0.03 |
| 10 | 300 | 1 | 50 | 31 | −9.00E+18 | 0.04 |
| 30 | 300 | 1 | 50 | 23 | −9.00E+17 | 0.7 |
| 0 | 500 | 1 | 50 | 3 | −2.00E+19 | 0.02 |
| 10 | 500 | 1 | 50 | 33 | −5.00E+18 | 0.009 |
| 20 | 500 | 1 | 50 | 32 | −1.00E+18 | 0.2 |
| 30 | 500 | 1 | 50 | 25 | −5.00E+17 | 0.9 |
| 40 | 500 | 1 | 50 | 10 | −1.00E+16 | 10 |
| 10 | 300 | 0 | 50 | 4 | −2.00E+20 | 0.009 |
| 20 | 300 | 0 | 50 | 30 | −2.00E+19 | 0.01 |
| 30 | 300 | 0 | 50 | 43 | −1.00E+19 | 0.02 |
| 40 | 300 | 0 | 50 | 9 | −1.00E+16 | 80 |
| 10 | 500 | 0 | 50 | 23 | −9.00E+18 | 0.05 |
| 20 | 500 | 0 | 50 | 46 | −8.00E+19 | 0.04 |
| 30 | 500 | 0 | 50 | 47 | −7.00E+18 | 0.05 |
| 40 | 500 | 0 | 50 | 34 | −9.00E+17 | 0.3 |
| 50 | 500 | 0 | 50 | 15 | −4.00E+16 | 20 |

Table V shows the affect of the power density applied on the mobility, carrier concentration, and resistivity of the semiconductor film. Generally, the power density does not greatly affect the mobility, but the higher the power density, the higher the carrier concentration and resistivity. In one embodiment, the power density applied to the sputtering target may be between about 0.3 W/cm$^2$ and about 1.0 W/cm$^2$.

TABLE V

| $O_2$ Flow Rate (sccm) | $N_2$ Flow Rate (sccm) | Percent Dopant (%) | Power applied (W/cm$^2$) | Temperature (Celsius) | Mobility (cm$^2$/V-s) | Carrier Concentration (#/cc) | Resistivity (ohm-cm) |
|---|---|---|---|---|---|---|---|
| 0 | 500 | 2.8 | 0.47 | 50 | 13 | −8.00E+17 | 1 |
| 10 | 500 | 2.8 | 0.47 | 50 | 19 | −1.00E+18 | 0.03 |
| 20 | 500 | 2.8 | 0.47 | 50 | 30 | −8.00E+17 | 0.08 |
| 30 | 500 | 2.8 | 0.47 | 50 | 22 | −5.00E+15 | 95 |
| 0 | 500 | 2.8 | 0.7 | 50 | 3 | −1.00E+18 | 0.8 |
| 10 | 500 | 2.8 | 0.7 | 50 | 30 | −1.00E+18 | 0.3 |
| 20 | 500 | 2.8 | 0.7 | 50 | 29 | −2.00E+18 | 0.1 |
| 30 | 500 | 2.8 | 0.7 | 50 | 20 | −8.00E+17 | 0.9 |
| 40 | 500 | 2.8 | 0.7 | 50 | 4 | −2.00E+16 | 200 |

Table VI shows the effects of utilizing $N_2O$ as the oxygen containing gas in depositing the semiconductor film. The $N_2O$ gas is effective as an oxygen containing gas in raising the mobility of the semiconductor film and producing a reasonably low carrier concentration.

TABLE VI

| $N_2O$ Flow Rate (sccm) | $N_2$ Flow Rate (sccm) | Power applied (W/cm$^2$) | Temperature (Celsius) | Mobility (cm$^2$/V-s) | Carrier Concentration (#/cc) |
|---|---|---|---|---|---|
| 10 | 500 | 0.35 | 50 | 18 | −9.00E+18 |
| 20 | 500 | 0.35 | 50 | 42 | −9.00E+18 |
| 30 | 500 | 0.35 | 50 | 58 | −8.00E+18 |
| 40 | 500 | 0.35 | 50 | 57 | −7.00E+18 |
| 50 | 500 | 0.35 | 50 | 52 | −5.00E+18 |
| 60 | 500 | 0.35 | 50 | 40 | −2.00E+18 |
| 70 | 500 | 0.35 | 50 | 25 | −2.00E+17 |
| 10 | 500 | 0.35 | 180 | 95 | −1.00E+19 |
| 20 | 500 | 0.35 | 180 | 110 | −9.00E+18 |
| 30 | 500 | 0.35 | 180 | 75 | −5.00E+17 |
| 40 | 500 | 0.35 | 180 | 65 | −9.00E+17 |
| 50 | 500 | 0.35 | 180 | 55 | −5.00E+18 |
| 60 | 500 | 0.35 | 180 | 40 | −2.00E+18 |
| 70 | 500 | 0.35 | 180 | 25 | −6.00E+17 |

Table VII show the chemical analysis for a semiconductor film that comprises tin, oxygen, and nitrogen and shows the effect of oxygen containing gas upon the film using X-ray photoelectron spectroscopy (XPS). Film 1 was deposited by sputtering a tin target for 360 seconds while a DC bias of 400 W was applied to the sputtering target. Argon was introduced to the processing chamber at a flow rate of 60 sccm, nitrogen was introduced at a flow rate of 200 sccm, and oxygen was introduced at a flow rate of 5 sccm. The deposition occurred at a temperature of 250 degrees Celsius. Film 1 had a carbon content of Film 1 was 22.5 atomic percent, a nitrogen content of 19.4 atomic percent, an oxygen content of 29.4 atomic percent, a fluorine content of 0.7 atomic percent, and a tin content of 28.1 atomic percent. Most, if not all, of the carbon could arise from adventitious carbon (i.e., carbon compounds adsorbed onto the surface of any sample exposed to the atmosphere). Film 2 was deposited by sputtering a tin target for 360 seconds while a DC bias of 400 W was applied to the sputtering target. Argon was introduced to the processing chamber at a flow rate of 60 sccm, nitrogen was introduced at a flow rate of 200 sccm, and oxygen was introduced at a flow rate of 20 sccm. The deposition occurred at a temperature of 250 degrees Celsius. Film 2 had a carbon content of 17.3 atomic percent, a nitrogen content of 4.5 atomic percent, an oxygen content of 49.9 atomic percent, a fluorine content of 0.6 percent, and a tin content of 27.7 atomic percent. Most, if not all, of the carbon could arise from adventitious carbon (i.e., carbon compounds adsorbed onto the surface of any sample exposed to the atmosphere). As shown in Table VII, as the oxygen flow rate (and hence, the ratio of oxygen to nitrogen) increases, the oxynitride content increases as well as does the tin oxide content. However, the tin nitride content and silicon oxynitride content is reduced. In Table VII, R equals oxygen or nitrogen.

TABLE VII

| | | Film 1 | Film 2 | Beam Energy (eV) |
|---|---|---|---|---|
| Carbon Chemical State | C—C, CH$_x$ | 76.0 | 73.7 | 285.0 |
| | C—R | 12.6 | 12.0 | 286.4 |
| | O═C | 2.8 | 4.4 | 287.9 |
| | O═C—R | 8.6 | 10.0 | 289.1 |
| Nitrogen Chemical State | Nitride | 79.0 | 56.2 | 396.9 |
| | Oxynitride | 19.5 | 22.7 | 397.7 |
| | Organic N | 1.3 | 10.4 | 399.1 |
| | NH$^{4+}$ | 0.0 | 10.7 | 402.8 |
| Tin Chemical State | Sn | 1.4 | 2.1 | 484.8 |
| | SnO$_2$ | 71.9 | 84.4 | 486.4 |
| | SnN$_x$, SnON | 26.7 | 13.4 | 487.3 |
| Oxygen Chemical State | SnO$_x$ | 51.7 | 69.8 | 530.7 |
| | Organic O | 48.3 | 30.2 | 532.1 |

Table VIII shows the results for several semiconductor films that were deposited by sputtering. The semiconductor films comprised zinc, tin, oxygen, and nitrogen. The semiconductor films were sputter deposited from a sputtering target having a zinc content of 70 atomic percent and a tin content of 30 atomic percent. The deposition occurred at a temperature of 250 degrees Celsius with a power of 400 W applied to the sputtering target. The deposition occurred for 360 seconds under an argon flow rate of 60 sccm and an oxygen flow rate of 20 sccm. The data shows that the mobility of the semiconductor film increases as the nitrogen flow rate (and hence, the ratio of nitrogen gas to oxygen gas) increases.

TABLE VIII

| Film | $N_2$ (sccm) | SEM Thickness (micrometers) | Rs | Mobility ($cm^2$/V-s) | Ns | N |
|---|---|---|---|---|---|---|
| 1 | 0.0 | 1.82 | 3.65E+05 | 0.0155 | −1.10E+15 | −6.06E+18 |
| 2 | 100.0 | 0.18 | 2.88E+07 | 1.1200 | 1.93E+11 | 1.05E+16 |
| 3 | 150.0 | 0.18 | 9.69E+03 | 4.7000 | −1.37E+14 | −7.44E+18 |
| 4 | 200.0 | 0.17 | 1.33E+03 | 14.0000 | −3.34E+14 | −1.93E+19 |

Figure 2A:
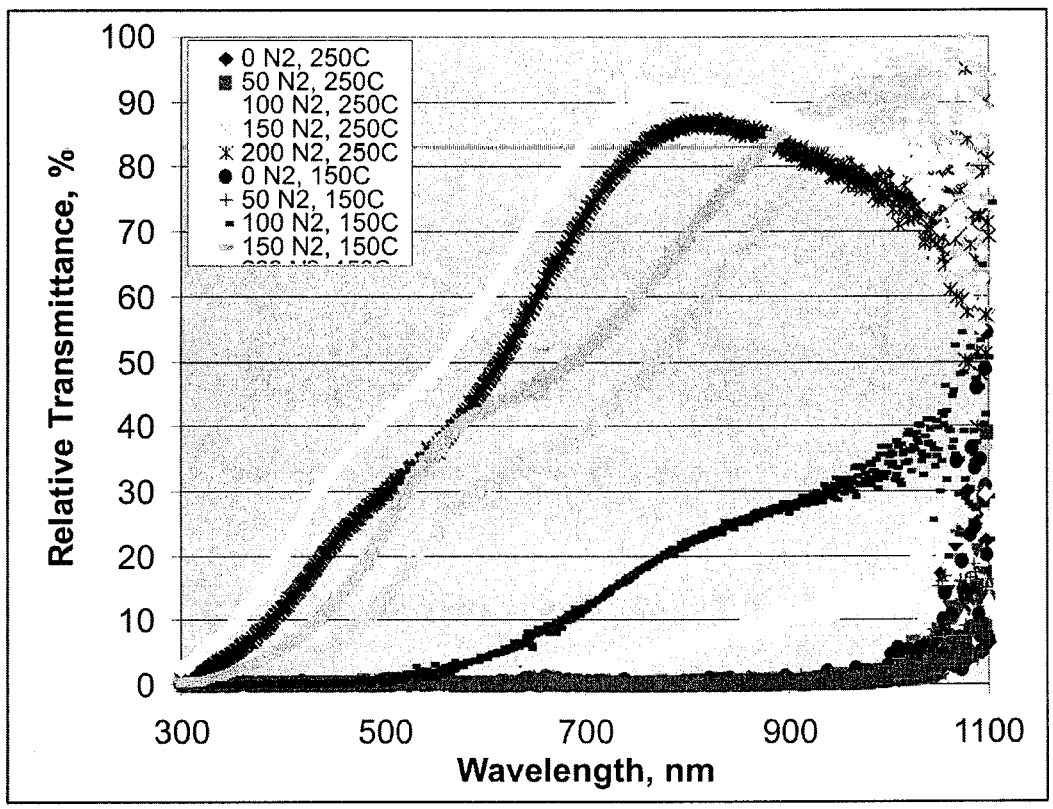
FIG. 2A is a graph showing the effect of nitrogen flow rate on the transmittance of a semiconductor film having tin, oxygen, and nitrogen.

FIG. 2A is a graph showing the effect of nitrogen flow rate on the transmittance of a semiconductor film having tin, oxygen, and nitrogen. The nitrogen gas moves the optical adsorption edge toward a short wavelength or a larger band gap. The increased nitrogen flow rate may cause the film to be more transparent in the visible range.

Figure 2B:
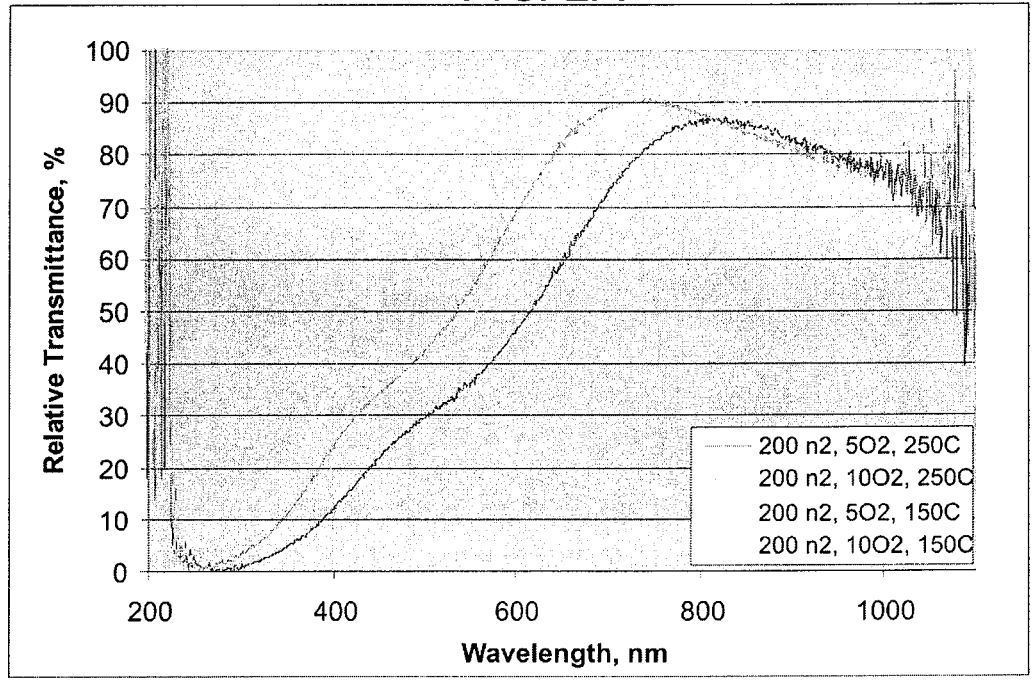
FIG. 2B is a graph showing the effect of oxygen flow rate on the transmittance of a semiconductor film having tin, oxygen, and nitrogen.

FIG. 2B is a graph showing the effect of oxygen flow rate on the transmittance of a semiconductor film having tin, oxygen, and nitrogen. The greater the oxygen flow rate, the more the absorption edge moves to the shorter wavelength or a larger band gap. The absorption edge will move towards the shorter wavelength at higher temperatures.

Figure 3A:
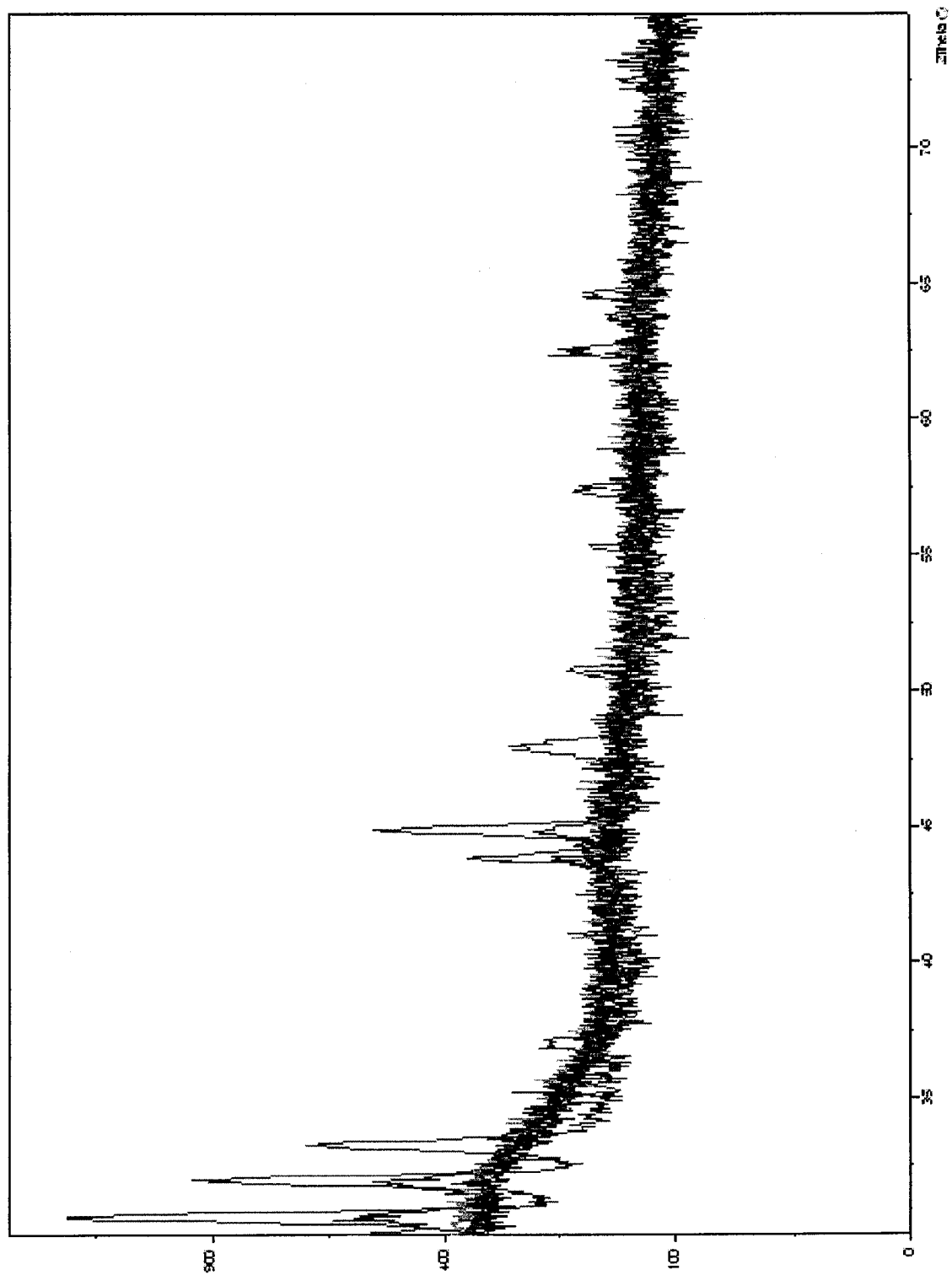
FIGS. 3A and 3B and XRD graphs showing the film structure of a semiconductor film containing tin, nitrogen, and oxygen.
Figure 3B:
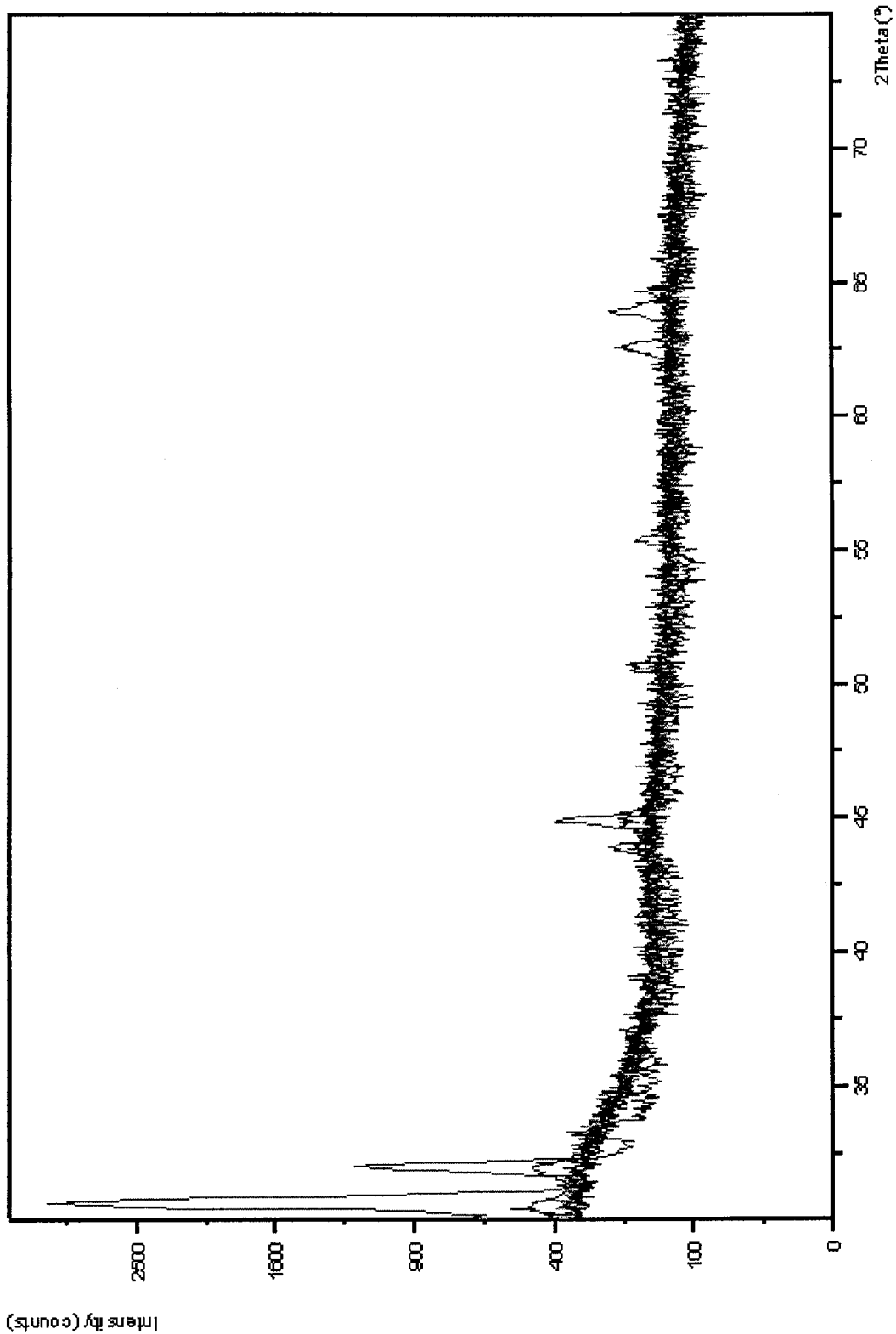

FIGS. 3A and 3B and XRD graphs showing the film structure of a semiconductor film containing tin, nitrogen, and oxygen. The film structure changes from the metal tin crystal structure to an amorphous structure as the ratio of nitrogen to oxygen increases. FIG. 3A shows the results for a 250 degrees Celsius deposition. FIG. 3B shows the results for a 150 degrees Celsius deposition.

While the semiconductor film is described as being deposited by sputtering a metal target that may contain a dopant, it is to be understood that other deposition methods may be utilized. In one embodiment, the sputtering target may containing the metal, oxygen, and nitrogen and be biased with an RF current. In another embodiment, precursor gases may be introduced to a processing chamber to deposit the semiconductor film by CVD or ALD. In another embodiment, liquid precursors may be introduced to a processing chamber or a reactant may be introduced to deposit the semiconductor film by spin-on, sol-gel, or plating processes.

The semiconductor film may be used in various devices such as TFTs, OLEDs, and solar panels to name a few. The semiconductor film may be deposited onto any number of substrates such as silicon wafers, glass substrates, soda lime glass substrates, plastic substrates, etc. The substrates may comprise any shape or size such as 200 mm wafers, 300 mm wafers, 400 mm wafers, flat panel substrates, polygonal substrates, roll-to-roll substrates, etc. The semiconductor film may be amorphous. In one embodiment, the semiconductor film may be crystalline. The semiconductor film may also be annealed after depositing.

Nitrogen containing gas to oxygen containing gas flow ratios of about 10:1 to about 50:1 may produce semiconductor films having a mobility greater than 20 times the mobility of amorphous silicon and 2 times the mobility of polysilicon. In one embodiment, the nitrogen containing gas to oxygen containing gas flow ratios may be between about 5:1 to about 10:1. Annealing the deposited semiconductor film may increase the mobility of the film to more than 90 $cm^2$/V-s. The annealing may occur in a nitrogen atmosphere at a temperature of about 400 degrees Celsius. At high temperatures such as about 600 degrees Celsius, the semiconductor film may be converted to a p-type from an n-type semiconductor film. The semiconductor film is stable and may develop a natural passivation layer thereon over a period of time. The passivation layer may extend to a depth of less than about 25 Angstroms.

The deposited semiconductor film may have a band gap of between about 3.1 eV to about 1.2 eV, which equates to about 400 nm to about 1,000 nm wavelength. Due to the lower band gap, the semiconductor film may be useful for photovoltaic devices. The band gap may be adjusted by altering the deposition parameters such as nitrogen to oxygen flow ratio, power density, pressure, annealing, and deposition temperature. By increasing the amount of oxygen supplied relative to the nitrogen, the band gap may be increased. The band gap energy within the semiconductor film may be graded to fine tune the band gap throughout the film. For example, it may be desirable to have a higher band gap energy near the surface of the semiconductor layer and then adjust the band gap energy throughout the thickness of the layer. By controlling the proportionate amount of oxygen gas flow relative to the amount of nitrogen and argon, the band gap distribution may be controlled.

A semiconductor film comprising oxygen, nitrogen, and one or more elements selected from the group consisting of zinc, indium, gallium, cadmium, and tin may be more stable and have a higher mobility than amorphous silicon and poly silicon. Thus, the semiconductor film may replace silicon as the dominate semiconductor material in electronic devices.

While the foregoing is directed to embodiments of the present invention, other and further embodiments of the invention may be devised without departing from the basic scope thereof, and the scope thereof is determined by the claims that follow.

The invention claimed is:

1. A sputtering method comprising:
   flowing an oxygen containing gas, an inert gas, and a nitrogen containing gas into a processing chamber;
   applying a DC electrical bias to a sputtering target comprising a dopant and one or more metals selected from the group consisting of zinc, gallium, cadmium, indium, and tin;
   depositing a semiconductor layer on a substrate, the semiconductor layer comprising the one or more metals, the dopant, oxygen, and nitrogen, wherein at least a portion of the semiconductor layer comprises an oxynitride compound;
   increasing the ratio of the flow rates of the nitrogen containing gas to the oxygen containing gas during deposition of the semiconductor layer to increase electron mobility of the semiconductor layer, wherein the ratio of the flow rates of the nitrogen containing gas to the oxygen containing gas is above about 10:1, wherein the oxygen containing gas has a flow rate of greater than 10 sccm, and wherein the semiconductor layer has an electron mobility that is greater than 20 times an electron mobility of amorphous silicon; and annealing the deposited semiconductor layer at a temperature above about 250 degrees Celsius, wherein the semiconductor layer has an electron mobility of greater than 90 cm$^2$/V-s.

2. The method of claim 1, wherein the semiconductor layer comprises two or more metals selected from the group consisting of zinc, gallium, cadmium, indium, and tin.

3. The method of claim 1, wherein the dopant is selected from the group consisting of aluminum, tin, gallium, calcium, silicon, titanium, copper, germanium, indium, nickel, chromium, vanadium, magnesium, and combinations thereof.

4. The method of claim 1, wherein at least a portion of the semiconductor layer further comprises a nitride compound.

5. The method of claim 1, wherein the semiconductor layer is amorphous or has a nanocrystalline structure.

6. The method of claim 1, wherein the nitrogen containing gas and the oxygen containing gas are separate gases.

* * * * *